United States Patent
Kanagawa et al.

(10) Patent No.: US 7,405,479 B2
(45) Date of Patent: Jul. 29, 2008

(54) WIRED CIRCUIT BOARD

(75) Inventors: Hitoki Kanagawa, Osaka (JP); Tetsuya Ohsawa, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 11 days.

(21) Appl. No.: 11/224,108

(22) Filed: Sep. 13, 2005

(65) Prior Publication Data

US 2006/0202357 A1     Sep. 14, 2006

(30) Foreign Application Priority Data

Sep. 14, 2004     (JP)     ............................. 2004-267275

(51) Int. Cl.
*H01L 23/48*     (2006.01)
(52) U.S. Cl. ................ 257/738; 257/779; 257/E23.015
(58) Field of Classification Search ................ 257/779, 257/737, 669, 758, 670, 738, 780, E23.015, 257/E23.02, E23.23
See application file for complete search history.

(56) References Cited

U.S. PATENT DOCUMENTS

| 5,376,584 | A | 12/1994 | Agarwala |
| 6,323,542 | B1 * | 11/2001 | Hashimoto ................... 257/669 |
| 2002/0007961 | A1 | 1/2002 | Yamato et al. |
| 2002/0187585 | A1 | 12/2002 | Tsukada et al. |

FOREIGN PATENT DOCUMENTS

JP     HEI. 11-266066     9/1999

* cited by examiner

*Primary Examiner*—Howard Weiss
*Assistant Examiner*—Hoa B Trinh
(74) *Attorney, Agent, or Firm*—Jean C. Edwards, Esq.; Akerman Senterfitt (57) ABSTRACT

A wired circuit board having terminals that can ensure large electrical connection areas while preventing shorting of adjacent terminals, to ensure that the terminals are electrically connected with external terminals through molten metal. An insulating base layer 3 is formed on a supporting board 2 so that insulating concave portions 13 are formed at portions thereof where external connecting terminals 8 are to be formed. A conductive pattern 4 is formed on the insulating base layer 3 so that a number of lines of wire 4a, 4b, 4c, 4d, the magnetic head connecting terminals 7, and the external connecting portions 8 are integrally formed, and conductive concave portions 9 are formed in the external connecting terminals 8. Thereafter, an insulating cover layer 10 is formed on the insulating base layer 3 so that the magnetic head connecting terminals 7 and the external connecting terminals 8 are exposed from the insulating cover layer 10. In the suspension board with circuit 1 thus formed, when the external connecting terminals 8 are connected with connecting terminals of a read/write substrate via the solder balls 21, reliable connection therebetween can be ensured.

4 Claims, 8 Drawing Sheets

WIRED CIRCUIT BOARD

This application claims priority from Japanese Patent Appln. No. 2004-267275, filed Sep. 14, 2004, the contents of which are herein incorporated by reference in their entirety.

BACKGROUND OF THE INVENTION

1. Field of the Invention

The present invention relates to a wired circuit board and, more particularly, to a wired circuit board having terminals to be connected to external terminals through molten metal.

2. Description of the Prior Art

A wired circuit board usually has terminals to be connected to external terminals as a part of a conductive pattern of the wired circuit board.

Molten metal, such as, for example, solder balls, is often used for connecting the terminals of the wired circuit board to the external terminals. The solder balls are placed on the terminals and are melted on the surfaces of the terminals, whereby the terminals of the wired circuit board are electrically connected to the external terminals through the solder balls.

When the terminals have flat surfaces, the solder balls can roll around the surfaces of the terminals. Prior art proposes an attempt solution that electrodes (terminals) formed on the substrate are provided, at center portions thereof, with cavities to place the solder balls on the electrodes stably (Cf. JP Laid-open (Unexamined) Patent Publication No. Hei 11-266066, for example).

In addition, the prior art proposes a solution that a solder plating layer of ring form is laminated on those electrodes formed in ring form by solder plating, to secure a large connection area for the solder ball (Cf. JP Laid-open (Unexamined) Patent Publication No. Hei 11-266066, for example).

However, in the electrodes formed in ring form described by JP Laid-open (Unexamined) Patent Publication No. Hei 11-266066, the substrate is exposed from lower ends of the cavities. Due to this, when the solder balls are placed in the cavities, electrical connection areas for the solder balls to be electrically connected with the electrodes are ensured only by around the inside of the cavities, so there may be cases where insufficient electrical connection areas are provided for the solder balls.

In addition, when the solder plating layer of ring form is laminated on the electrodes formed in ring form, larger electrical connection areas can be ensured, but such a solder plating layer may be melted accompanied by the melting of the solder balls, then causing, especially when the conductive pattern is a fine pattern, adjacent electrodes to be shorted with the spilled solder.

SUMMARY OF THE INVENTION

It is the object of the invention to provide a wired circuit board having terminals that can ensure large electrical connection areas while preventing shorting of adjacent terminals, to ensure that the terminals are electrically connected with external terminals through molten metal.

The present invention provides a novel wired circuit board comprising an insulating layer and a conductive pattern formed on the insulating layer, wherein the conductive pattern includes terminals to be connected with external terminals through molten metal, and the terminals have concave portions for receiving the molten metal which are integrally formed with the conductive pattern.

In the wired circuit board of the present invention, it is preferable that a metal supporting layer is provided on the other side of the insulating layer opposite one side thereof on which the conductive pattern is provided.

In the wired circuit board of the present invention, the terminals have the concave portions for receiving the molten metal which are integrally formed with the conductive pattern. This can provide the result that when the molten metal is placed in the concave portions of the terminals, the molten metal can well be held by the concave portions and also the electrical connection areas for the terminals to be electrically connected with the molten metal are ensured by the inside surfaces of the concave portions and the bottoms extending continuously with lower ends of the inside surfaces of the concave portions. This can provide the result of ensuring that sufficient electrical connection areas are provided for the terminals. In addition, since the concave portions are integrally formed with the conductive pattern, the concave portions can be prevented from being melted by the melting of the molten metal. This can provide the result that possible shorting of adjacent terminals accompanied by the melting can be prevented.

DETAILED DESCRIPTION OF THE INVENTION

Figure 1:
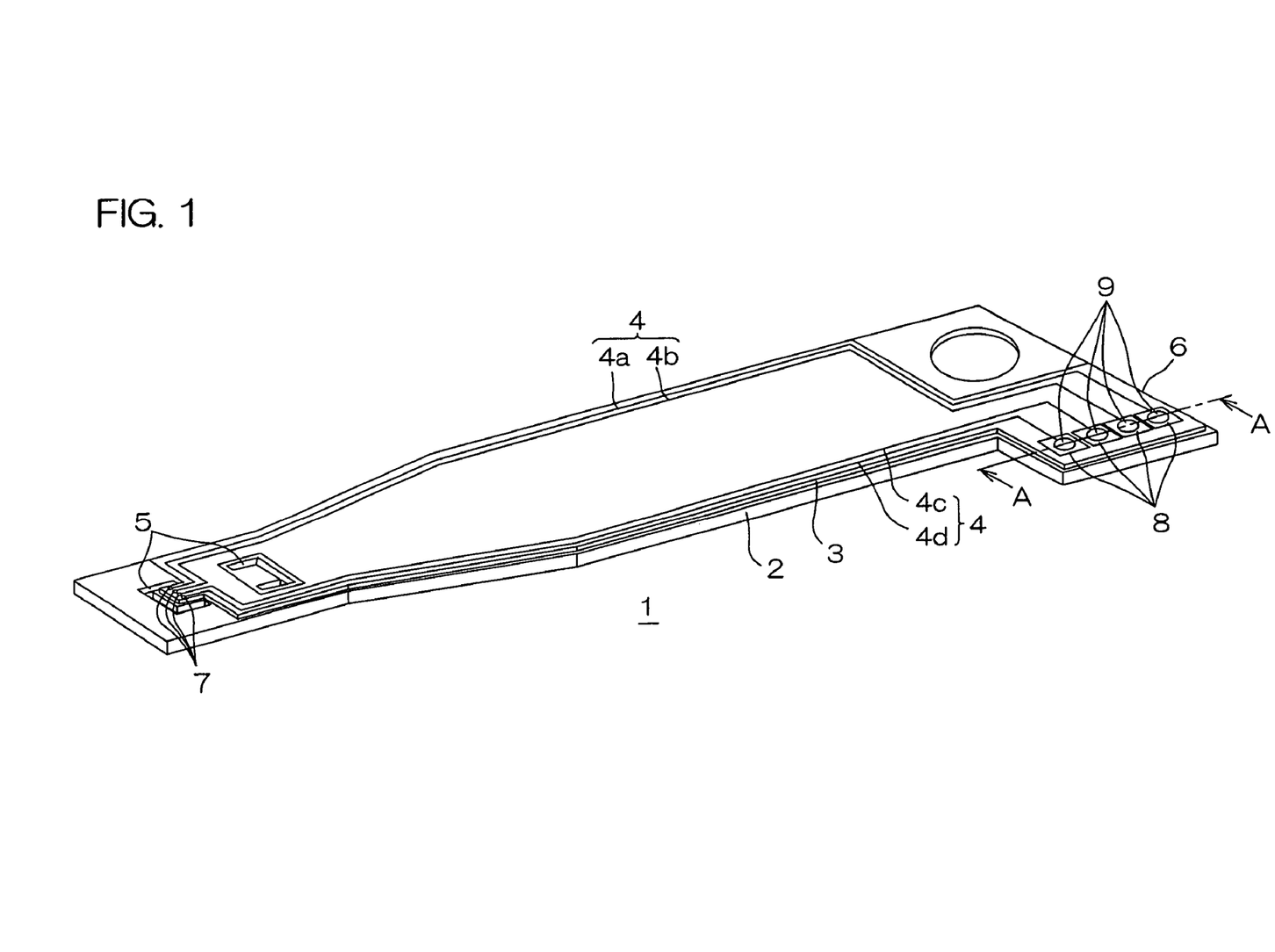
FIG. 1 is a perspective view showing a suspension board with circuit presented as an embodiment of a wired circuit board of the present invention.

FIG. 1 is a perspective view showing a suspension board with circuit presented as an embodiment of a wired circuit board of the present invention.

In FIG. 1, the suspension board with circuit 1 is designed to mount a magnetic head of a hard disc drive (not shown) thereon and hold it against an airflow generated when the magnetic head and a magnetic disk run relative to each other, while supporting the magnetic head closely spaced from the magnetic disc. A conductive pattern 4 for connecting between the magnetic head and a read-write substrate is integrally formed with the suspension board with circuit 1.

This suspension board with circuit 1 comprises a supporting board 2 serving as a metal supporting layer, an insulating base layer 3 serving as an insulating layer formed on the supporting board 2, and a conductive layer 4 formed on the insulating base layer 3.

The supporting board 2 is formed by a thin plate extending longitudinally. The supporting board 2 has a gimbal portion 5, formed at a front end portion thereof, for mounting the magnetic head, and a terminal arranging portion 6, formed at a rear end portion thereof, for arranging each external connecting terminal portion 8 mentioned later along a longitudinal direction of the supporting board 2. The terminal arranging portion 6 protrudes to one widthwise side of the supporting board 2 (orthogonal to the longitudinal direction of the supporting board 2).

The insulating base layer 3 includes a part of the supporting board 2 where the conductive pattern 4 is formed, and is formed with a predetermined pattern.

The conductive pattern 4 comprises a number of lines of wire 4a, 4b and 4c, 4d, magnetic head connecting terminals 7, and external connecting terminals 8 serving as a terminal portion, which are formed in a unified manner. The lines of wire 4a, 4b, 4c, 4d are extended along the longitudinal direction of the supporting board 2 and are arranged in parallel at spaced intervals with respect to the widthwise direction.

The magnetic head connecting terminals 7 are arranged at the front end portion of the supporting board 2 to correspond to the respective lines of wire 4a, 4b, 4e, and 4d. The magnetic head connecting terminals 7 are integrally formed with the supporting board 2 to continuously extend from front end portions of the respective lines of wire 4a, 4b, 4c, 4d and are spaced apart from each other along the widthwise direction of the supporting board 2. The magnetic head (not shown) is mounted on the magnetic head connecting terminals 7.

Figure 6:
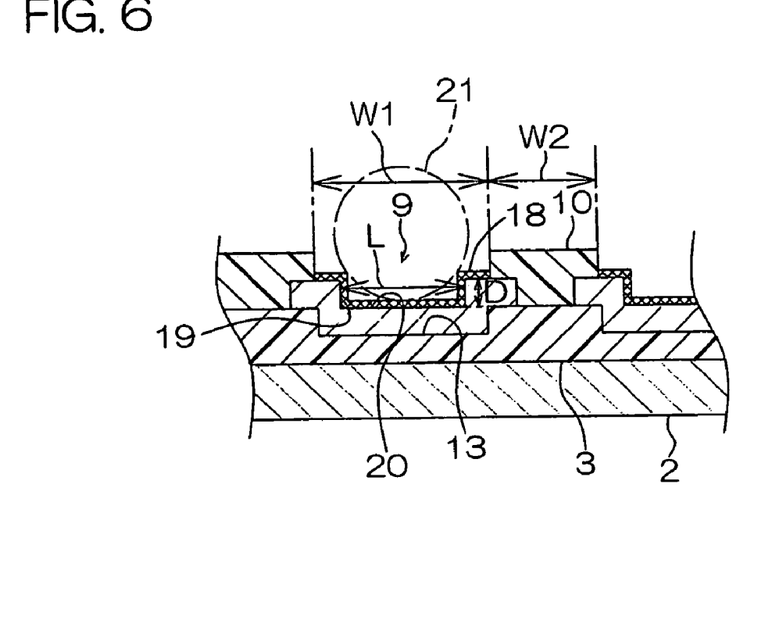
FIG. 6 is an enlarged sectional view of an external connecting terminal of the suspension board with circuit shown in FIG. 1.

The external connecting terminals 8 are arranged in the terminal arranging portion 6 at the rear end portion of the supporting board 2 to correspond to the lines of wire 4a, 4b, 4c, and 4d, respectively. The external connecting terminals 8 are integrally formed with the supporting board 2 to continuously extend from the rear end portions of the respective lines of wire 4a, 4b, 4c, 4d and are spaced apart from each other along the longitudinal direction of the supporting board 2. The connection with the external connecting terminals 8 is performed using connecting terminals of a read/write board (not shown) serving as the external terminals and solder balls 21 (Cf. FIG. 6) serving as molten metal.

Each external connecting terminal 8 is formed in generally square form as viewed from top and has a conductive concave portion 9 in the form of a concave portion for receiving the solder ball 21. The conductive concave portion 9 is formed in generally circular form and is formed integrally with the conductive pattern 4.

Figure 2:
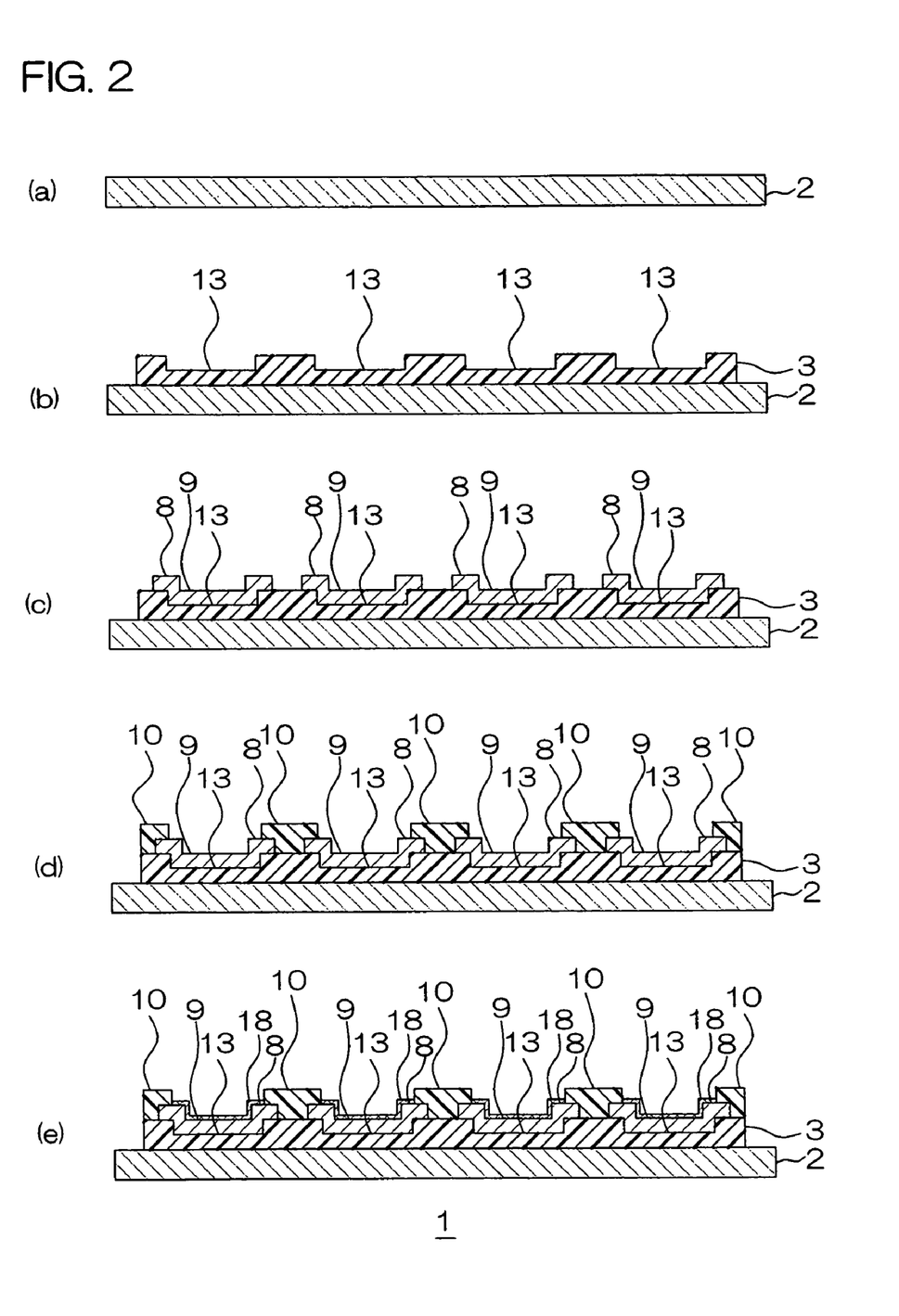
FIG. 2 is a process drawing showing an embodiment of a production method of the suspension board with circuit shown in FIG. 1, (a) showing the process of preparing a supporting board, (b) showing the process of forming an insulating base layer with a predetermined pattern on the supporting board, (c) showing the process of forming a conductive pattern on the insulating base layer, (d) showing the process of forming an insulating cover layer with a predetermined pattern on the insulating base layer, and (e) showing the process of forming a plating layer on each magnetic head connecting terminal and each external connecting terminal.

Though not shown in FIG. 1, an insulating cover layer 10 formed in a predetermined pattern (Cf. FIG. 2(d)) is formed on the insulating base layer 3 to cover the conductive pattern 4.

Next, a production method of this suspension board with circuit 1 will be described with reference to FIGS. 2-5. It should be noted that FIGS. 2-5 each shows a sectional view of the terminal arranging portion 6 of the supporting board 2 taken along the longitudinal direction of the supporting board 2.

In this method, the supporting board 2 is prepared, first, as shown in FIG. 2(a). A metal foil or a thin metal sheet is used as the supporting board 2. For example, stainless steel, 42-alloy, aluminum, copper-beryllium, phosphor bronze, etc. are used as the metal used for the supporting board 2. Preferably, stainless foil is used in terms of rigidity, corrosion resistance, and workability. The supporting board 2 has a thickness of e.g. 10-100 μm, or preferably 18-30 μm and a width of e.g. 50-500 mm, or preferably 125-300 mm.

Then, the insulating base layer 3 is formed in a predetermined pattern on the supporting board 2, as shown in FIG. 2(b).

No particular limitation is imposed on the insulating materials used for forming the insulating base layer 3. For example, synthetic resins, such as polyimide resin, polyamide imide resin, acrylic resin, polyether nitrile resin, polyether sulfonic resin, polyethylene terephthalate resin, polyethylene naphthalate resin, and polyvinyl chloride resin. Of these synthetic resins, polyimide resin is preferably used in terms of heat resistance, and chemical resistance. In addition, photosensitive synthetic resin is preferably used in terms of easiness in fine processing of the pattern. Further preferably, photosensitive polyimide resin is used.

Figure 3:
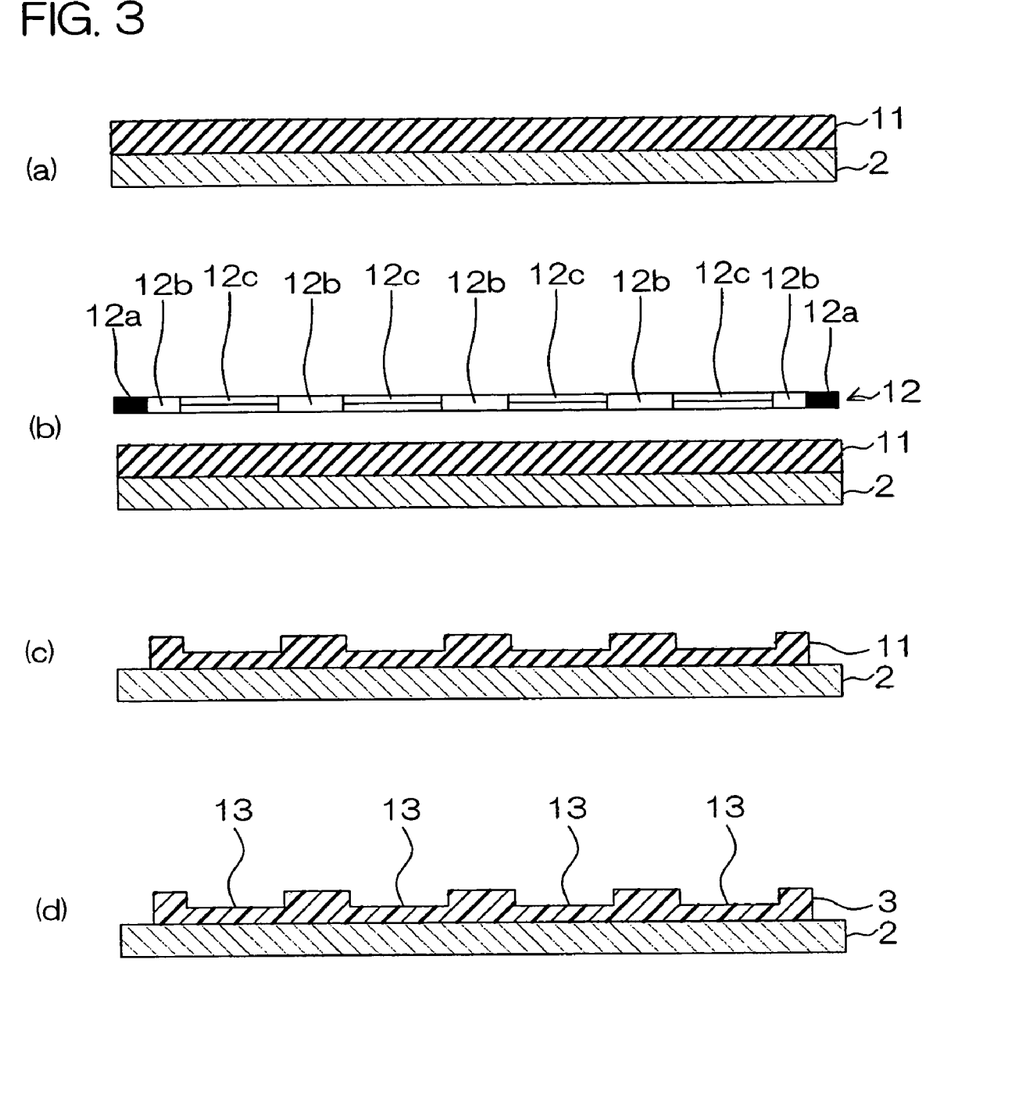
FIG. 3 is a detailed process drawing of the process of forming the insulating base layer on the supporting board shown in FIG. 2, (a) showing the process of forming a coating of precursor of photosensitive polyimide resin on the entire surface of the supporting board, (b) showing the process of exposing the coating to light through a photo mask, (c) showing the process of developing the coating, and (d) showing the process of curing the coating to form the insulting base layer of polyimide resin.

For example when photosensitive polyimide resin is used to form the insulating base layer 3 in the predetermined pattern on the supporting board 2, a solution of precursor of the photosensitive polyimide resin (photosensitive polyamic acid resin) is coated over the entire surface of the supporting board 2, as shown in FIG. 3(a). Then, it is heated at e.g. 60-150° C., or preferably at 80-120° C., to form a coating 11 of the precursor of the photosensitive polyimide resin.

Then, the coating 11 is exposed to light through a photo mask 12, as shown in FIG. 3(b). The photo mask 12 has a predetermined pattern comprising light shielding portions 12a, total-light-transmitting portions 12b, and semi-light-transmitting portions 12c. The light shielding portions 12a permit transmission of no light, and the total-light-transmitting portions 12b permit total transmission of light. The semi-light-transmitting portions 12c permit light to transmit in a light transmission ratio selected from the range falling within 10-90%, or preferably 30-60%, of the total transmission of 100%.

The photomask 12 is disposed opposite the coating 11 so that the light shielding portions 12a confront portions of the coating 11 where the insulating base layer 3 is not to be formed on the supporting board 2; the total-light-transmitting portions 12b confront portions of the coating 11 where the insulating base layer 3 is to be formed on the supporting board 2; and the semi-light-transmitting portions 12c confront portions of the coating 11 where the conductive concave portions 9 are to be formed in the respective external connecting terminals 8.

Preferably, light irradiated through the photomask 12 (irradiated radiation) has an exposure wavelength of e.g. 300-450 nm, or preferably 350-420 nm. An integrated quantity of exposure to light is preferably in the range of e.g. 100-2,000 mJ/cm$^2$.

Then, the coating 11 exposed to light is developed, after heated to a predetermined temperature, if necessary, as shown in FIG. 3(c). When the exposed-to-light portion of the coating 11 irradiated is heated at a temperature in the range of between e.g. 130° C. or more and less than 150° C., it is solubilized (positive type) in the next developing process. On the other hand, when heated at a temperature in the range of between e.g. 150° C. or more and 200° C. or less, it is insolubilized (negative type) in the next developing process.

The development can be performed by any known method, such as a dipping process and a spraying process, using a known developing solution such as alkaline developer. In this method, it is preferable that the negative pattern is formed in the coating 11. Illustrated in FIG. 3 is an embodiment using the process steps for forming the negative pattern.

In this developing process, the coating 11 is melted at marginal portions thereof confronting the light shielding portions 12a of the photomask 12, so that the marginal portions of the supporting board 2 are exposed. Also, it is partly melted at the portions thereof confronting the semi-light-transmitting portions 12c of the photomask 12 where the conductive concave portions 9 are to be formed. Accordingly, the coating 11 is formed in such a predetermined pattern that the portions confronting the semi-light-transmitting portions 12c have a thickness smaller than the portions confronting the total-light-transmitting portions 12b.

Then, the coating 11 formed in the predetermined pattern is heated finally to e.g. 250° C. or more to be cured (imidized). As a result, the insulating base layer 3 of polyimide resin is formed in the form of a predetermined pattern that the marginal portions of the supporting board 2 are exposed and also the insulating concave portions 13 are formed, in the coating 11 at portions thereof where the conductive concave portions 9 are to be formed, to have thickness smaller than the remaining portions, as shown in FIG. 3(d). The insulating concave portions 13 are formed in generally circular form as viewed from top, corresponding to the respective conductive concave portions 9.

As an alternative to using the photosensitive synthetic resin, for example the synthetic resin may be coated to form said pattern or may be previously processed in the form of a dry film having said pattern and then adhesively bonded to the supporting board 2 through an adhesive layer, if necessary.

The insulating base layer 3 thus formed has a thickness of e.g. 5-20 μm, or preferably 7-15 μm.

Then, the conductive pattern 4 is formed on the insulating base layer 3, as shown in FIG. 2(c). No particular limitation is imposed on the conductive materials used for the conductive pattern 4. For example, copper, nickel, gold, solder, or alloys thereof may be used. Copper is preferably used in terms of electrical conductivity, cost efficiency, and easiness in workability.

The conductive pattern 4 can be formed by a known patterning process, such as a subtractive process and an additive process. When the conductive pattern 4 is formed at fine pitch using the fine pitch technology, the additive process is preferably used.

Figure 4:
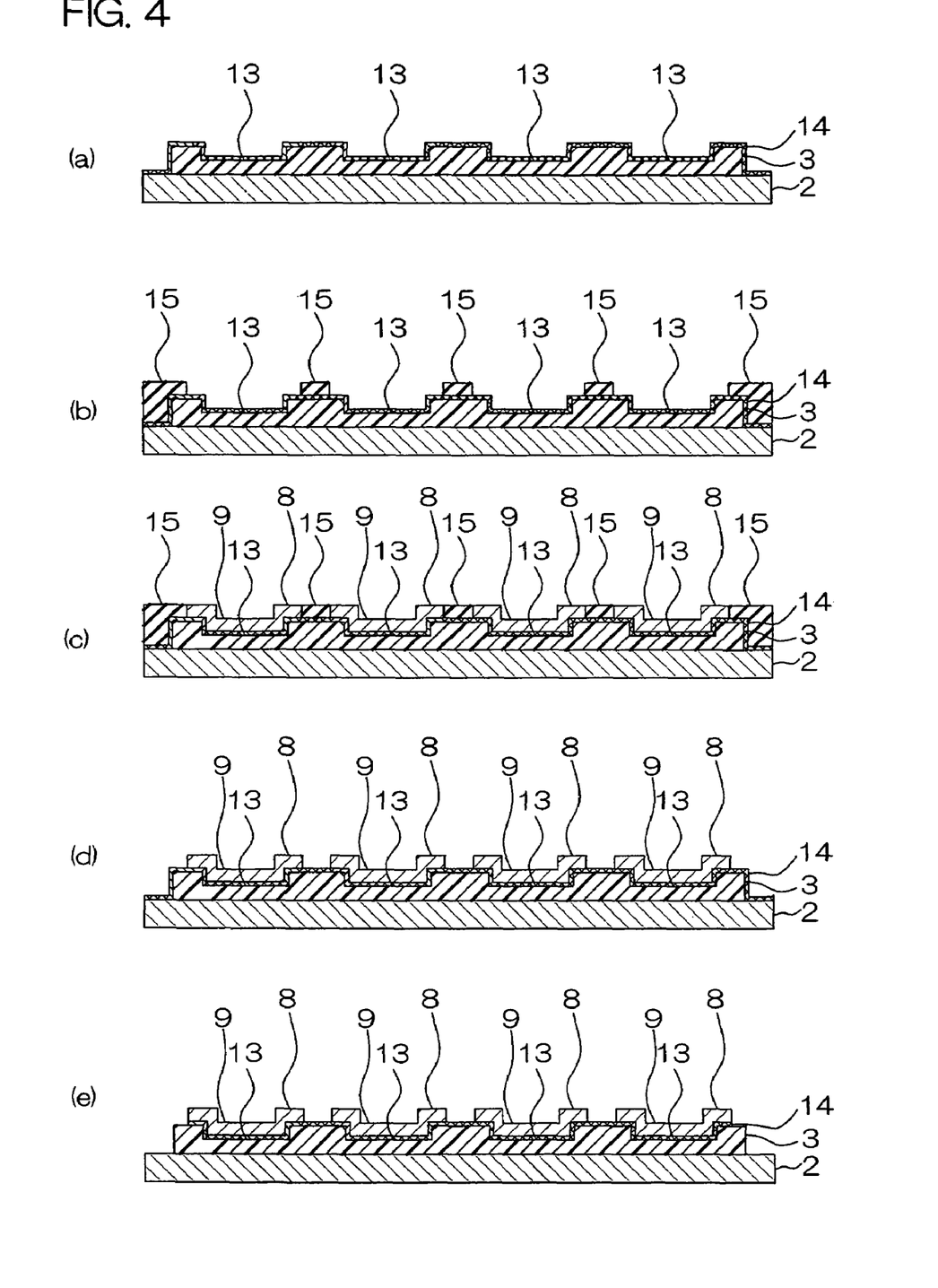
FIG. 4 is a detailed process drawing of the process of forming the conductive pattern on the insulating base layer shown in FIG. 2, (a) showing the process of forming a thin metal film on a surface of the supporting board exposed from the insulating base layer and on the entire surface of the insulating base layer, (b) showing the process of forming on a surface of the thin metal film a plating resist having a reverse pattern to the conductive pattern, (c) showing the process of forming the conductive pattern on the surface of the thin metal film exposed from the plating resist, (d) showing the process of removing the plating resist, and (e) showing the process of removing the thin metal film exposed from the conductive pattern.

In the additive process, a thin metal film 14 is formed as a seed film on a surface of the supporting board 2 exposed from the insulating base layer 3 and the entire surface of the insulating base layer 3, as shown in FIG. 4(a). The metal materials that may be used for the thin metal film 14 include, for example, chromium, nickel, copper, and alloys thereof. No particular limitation is imposed on the formation of the thin metal film 14. For example, the thin metal film 14 can be formed by a vacuum deposition process such as a sputtering process. Preferably, the thin metal film has thickness of e.g. 100-2,000 Å. The thin metal film 14 may be formed in multilayer, for example, by forming a thin chromium layer and a thin copper layer sequentially by the sputtering process.

Then, a plating resist 15 having a reverse pattern to the conductive pattern 4 is formed on the surface of the thin metal film 14, as shown in FIG. 4(b). To be more specific, the plating resist 15 is formed on the surface of the supporting board 2 and on the surface of the thin metal film 14 so that the thin metal film 14 can be exposed at potions thereof corresponding to the lines of wire 4a, 4b, 4c, 4d, the magnetic head connecting terminals 7 and the external connecting terminals 8.

The plating resist 15 is formed to have the reverse pattern to the conductive pattern 4 by a known process using a dry film photoresist, for example.

Then, the conductive pattern 4 is formed on the surface of the thin metal film 14 exposed from the plating resist 15, as shown in FIG. 4(c). No particular limitation is imposed on the formation of the conductive pattern 4. For example, the conductive pattern 4 can be formed thereon by electrolytic plating, or preferably electrolytic copper plating.

Thereafter, the plating resist 15 is removed, as shown in FIG. 4(d). The plating resist 15 is removed, for example, by a known etching process, such as a chemical etching (wet etching), or by stripping.

Then, the thin metal film 14 exposed from the conductive pattern 4 is removed, as shown in FIG. 4(e). The thin metal film 14 is removed, for example, by the chemical etching (wet etching).

After the processes mentioned above, the conductive pattern 4 including the lines of wire 4a, 4b, 4c, and 4d, the respective magnetic head connecting terminals 7 and the respective external connecting terminals 8, all of which are integrally formed, as shown in FIG. 1. In FIG. 1, the thin metal film 14 shown in FIG. 4 is omitted.

The conductive pattern 4 has a thickness of e.g. 5-20 µm, or preferably 7-15 µm, and the lines of wire 4a, 4b, 4c, and 4d have each a width of e.g. 5-500 µm, or preferably 10-200 µm. The interval between adjacent lines of wire 4a, 4b, 4c, and 4d is for example in the range of 5-500 µm, or preferably 10-200 µm.

Each external connecting terminal 8 has a width W1 of e.g. 80-1,100 µm, or preferably 120-540 µm, (a width of the portions of the conductive pattern exposed from the insulating cover layer 10 with respect to the dimensions extending along the longitudinal direction of the supporting board 2)(Cf. FIG. 6). The interval W2 between adjacent external connecting terminals 8 (Cf. FIG. 6) is for example in the range of 80-1,500 µm, or preferably 120-500 µm.

Also, the conductive concave portions 9 depressed toward the insulating base layer 3 are formed in the external connecting terminals 8 to correspond in position to the respective insulating concave portions 13. The conductive concave portions 9 have a diameter L (Cf. FIG. 6) of e.g. 50-1,000 µm, or preferably 100-500 µm, and a depth D (a dept from a top surface thereof to the deepest portion thereof)(Cf. FIG. 6) of e.g. 10-90%, or preferably 20-60%, of the thickness of the insulating base layer 3.

It is preferable that a nickel plating layer (not shown) is formed on the surface of the conductive pattern 4 by electroless nickel plating in a sequential process, to protect the conductive pattern 4.

Then, the insulating cover layer 10 is formed on the insulating base layer 3 to form a predetermined pattern that can allow the lines of wire 4a, 4b, 4c, 4d of the conductive pattern 4 to be covered and can allow the magnetic head connecting terminals 7 and the external connecting terminals 8 to be exposed, as shown in FIG. 2(d).

The same insulating material as that for the insulating base layer 3 is used for forming the insulating cover layer 10. Preferably, photosensitive polyimide resin is used for the insulating cover layer 10.

Figure 5:
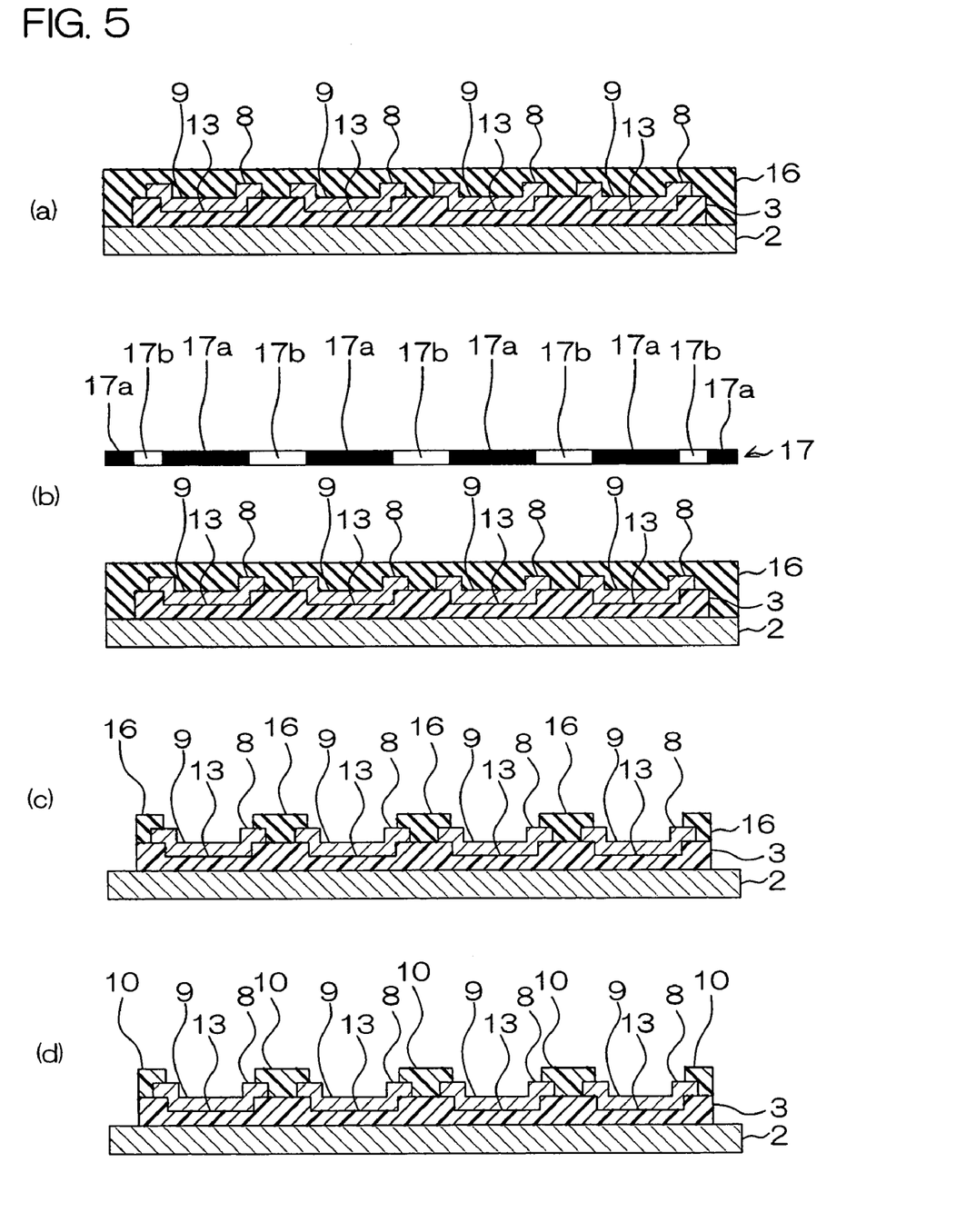
FIG. 5 is a detailed process drawing of the process of forming the insulating cover layer with a predetermined pattern on the insulating base layer shown in FIG. 2, (a) showing the process of forming a coating of precursor of photosensitive polyimide resin on the entire surface of the insulating base layer including the conductive pattern and of the supporting board, (b) showing the process of exposing the coating to light through a photo mask, (c) showing the process of developing the coating, and (d) showing the process of curing the coating to form the insulting cover layer of polyimide resin.

When the insulating cover layer 10 is formed using e.g. the photosensitive polyimide resin on the surface of the base insulating layer 3 in a predetermined pattern, a solution of precursor of the photosensitive polyimide resin (photosensitive polyamic acid resin) is coated over the entire surface of the insulating base layer 3 including the conductive pattern 4 and the entire surface of the supporting board 2, as shown in FIG. 5(a), and then is heated at e.g. 60-150° C., or preferably at 80-120° C., to form a coating 16 of the precursor of the photosensitive polyimide resin.

Then, the coating 16 is exposed to light through a photomask 17, as shown in FIG. 5(b). The photomask 17 has a predetermined pattern comprising light shielding portions 17a and total-light-transmitting portions 17b.

The photomask 17 is disposed opposite the coating 16 so that that the light shielding portions 17a confront portions of the coating 16 where the insulating base layer 3 is not to be formed on the supporting board 2 and portions of the coating 16 corresponding to the magnetic head connecting terminals 7 and the external connecting terminals 8, and the total-light-transmitting portions 17b confront portions of the coating 16 where the insulating cover layer 10 is to be formed on the insulating base layer 3 including the lines of wire 4a, 4b, 4c, 4d. Then, the coating 16 is exposed to light in the same manner as the coating 11 is.

Then, the coating 16 thus exposed to light is developed in the same manner as the coating 11 is, as shown in FIG. 5(c). Illustrated in FIG. 5 is an embodiment using the process steps for forming the negative pattern.

In this developing process, the coating 16 is melted at portions thereof confronting the light shielding portions 17a of the photomask 17 where the insulating base layer 3 is not formed on the supporting board 2 and corresponding to the respective magnetic head connecting terminals 7 and the respective external connecting terminals 8. Accordingly, the coating 16 is formed in such a predetermined pattern that the marginal portions of the supporting board 2, the magnetic head connecting portions 7, and the external connecting terminals 8 are exposed.

Then, the coating 16 formed in the predetermined pattern is heated finally to e.g. 250° C. or more to be cured (imidized). As a result, the insulating cover layer 10 of polyimide resin is formed in the form of a predetermined pattern that the respective lines of wire 4a, 4b, 4c, 4d are covered and also the respective magnetic head connecting terminals 7 and the respective magnetic head connecting terminals 8 are exposed as shown in FIG. 5(a).

As an alternative to using the photosensitive synthetic resin, for example the synthetic resin may be coated to form said pattern or may be previously processed in the form of a dry film having said pattern and then adhesively bonded to the insulating base layer 3 through an adhesive layer, if necessary.

The insulating cover layer 10 thus formed has a thickness of e.g. 1-30 µm, or preferably 2-20 µm.

Thereafter, a plating layer 18 is formed on the magnetic head connecting terminals 7 and the external connecting terminals 8 to cover their surfaces so as to protect those surfaces, as shown in FIG. 2(e). No particular limitation is imposed on plating material used for forming the plating layer 18. For example, nickel and gold are used for the plating layer 18.

The plating layer 18 is formed using the electrolytic plating, or electroless plating, for example. The plating layer 18 may be formed in multilayer, using nickel plating and gold plating in a sequential order. In this plating layer 18, the nickel plating layer has a thickness of e.g. 0.3-5 µm and the gold plating layer has a thickness of e.g. 0.05-5 µm.

The plating layer 18 on the external connecting terminals 8 is depressed toward the insulating base layer 3, so that it is formed in concave form corresponding to the conductive concave portions 9.

Then, the supporting board 2 is cut out into a predetermined shape of a gimbal 5 by a known process such as the chemical etching. After trimmed, it is rinsed and dried. The suspension board with circuit 1 shown in FIG. 1 is produced by the processes mentioned above. The trimming of the supporting board 2 may be performed before the plating layer 18 is formed.

In the suspension board with circuit 1 thus produced, the conductive concave portions 9 are formed in the external connecting terminals 8, to be integral with the conductive pattern 4, as shown in FIG. 6. This can provide the result that when the external connecting terminals 8 and the connecting terminals of the read/write substrate (not shown) are electrically connected with each other via the solder balls 21, the solder balls 21 can be held stably in the conductive concave portions 9 by simply placing the solder balls 21 in the conductive concave portions 9. Also, the electrical connection areas for the terminals to be electrically connected with the melted solder balls 21 can be ensured by the inside surfaces 19 of the conductive concave portions 9 and the bottoms 20 extending continuously with lower ends of the inside surfaces 19 of the conductive concave portions 9. This can provide the result of ensuring that sufficiently large electrical connection areas can be provided for the terminals. In addition, since the conductive concave portions 9 are integrally formed with the conductive pattern 4, the conductive concave portions 9 can be prevented from being melted accompanied by the melting of the solder balls 21. This can provide the result that even when the conductive pattern 4 is formed at fine pitch using the fine pitch technology, the conductive concave portions 9 can be effectively prevented from being melted accompanied by the melting of the solder balls 21 to cause shorting of adjacent external connecting terminals 8 by the spilled solder balls 21.

The connection between the external connecting terminals 8 and the connecting terminals of the read/write substrate via the solder balls 21 is carried out as follows. The solder balls 21 are placed in the conductive concave portions 9 of the external connecting terminals 8. Then, the connecting terminals of the read/write substrate (not shown) are disposed opposite the conductive concave portions 9 of the external connecting terminals 8 so that the connecting terminals can contact with the solder balls 21. Then, the solder balls 21 are melted by reflow soldering with conveyance or by the melting using laser thermo and the like.

Although the embodiment wherein the external connecting terminals 8 are formed in generally square form as viewed from top and the conductive concave portions 9 are formed in generally circular form as viewed form top has been illustrated above, the shape of the external connecting terminals 8 and the shape of the conductive concave portions 9 may be properly selected for intended purposes and applications, without any particular limitation being imposed thereon. For example, the respective conductive concave portions 9 may be formed in generally rectangular form as viewed from top. In this variant, one side of the rectangular conductive concave portions is e.g. 50-1,000 µm, or preferably 100-500 µm.

Although the suspension board with circuit 1 is presented as an example of the wired circuit board of the present invention, the wired circuit board of the present invention includes a single sided flexible wired circuit board, a double sided flexible wired circuit board, and a multilayer flexible wired circuit board.

Although the embodiment wherein the conductive concave portions 9 are formed in such a manner that the insulating concave portions 13 are formed in the insulating base layer 3, first, and, then the conductive concave portions 9 are formed to correspond in position to the insulating concave portions 13 has been illustrated above, only the conductive concave portions 9 may be formed without forming the conductive concave portions 13 in the insulating base layer 3.

Figure 7:
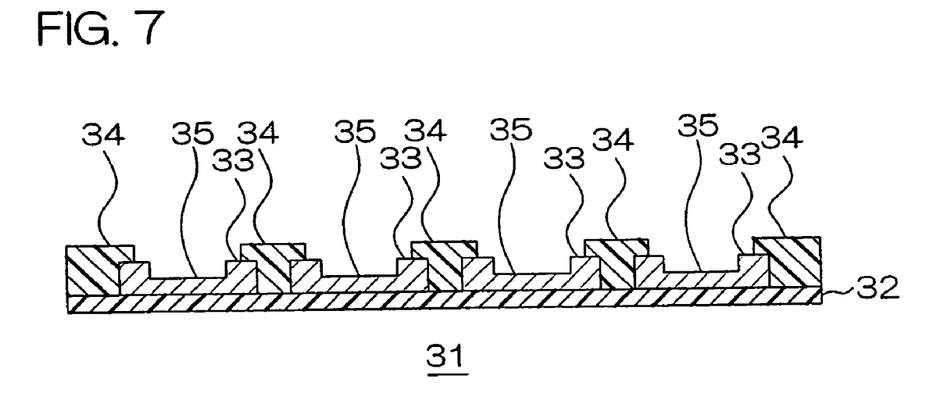
FIG. 7 is a sectional view showing a single sided flexible wired circuit board of an embodiment of the wired circuit board of the present invention.

For example, a single sided flexible wired circuit board 31 having terminals 33 with such conductive concave portions 35 is shown in FIG. 7 for illustrative purposes.

In the single sided flexible wired circuit board 31 shown in FIG. 7, a number of terminals 33 are formed on a flat, insulating base layer 32, to be integral with the conductive pattern. Then, an insulating cover layer 34 is formed on the insulating base layer 32 so that the conductive pattern can be covered with the insulating cover layer 34 and the respective terminals 33 can be exposed therefrom.

The terminals 33 are formed to have the respective conductive concave portions 35 depressed toward the insulating base layer 32.

These conductive concave portions 35 can be formed for example by the additive process wherein the electrolyrtic plating is made in two steps or by the subtractive process wherein the conductive concave portions 35 are half-etched.

Also, the suspension board with circuit 1 illustrated above can be industrially produced by a known process such as, for example, a roll-to-roll process.

EXAMPLE

While in the following, the present invention will be described in further detail with reference to Examples, the present invention is not limited thereto.

Example 1

The supporting board 2 of a stainless foil (SUS304) of 300 mm wide and 25 µm thick was prepared (Cf. FIG. 2(*a*)).

Then, after solution of precursor of photosensitive polyimide resin (photosensitive polyamic acid resin) was coated over the entire surface of the supporting board 2, the coated resin was heated for two minutes at 120° C., to form a coating 11 of the precursor of the photosensitive polyimide resin (Cf. FIG. 3(*a*)).

Thereafter, the photomask 12 was disposed opposite the coating 11 so that that the light shielding portions 12*a* confronted portions of the coating 11 where the insulating base layer 3 was not to be formed on the supporting board 2; the total-light-transmitting portions 12*b* confronted portions of the coating 11 where the insulating base layer 3 was to be formed on the supporting board 2; and the semi-light-transmitting portions 12*c* confronted portions of the coating 11 where the conductive concave portions 9 were to be formed in the respective external connecting terminals 8. Then, the coating 11 was exposed to ultraviolet light (an integrated quantity of exposure to light of 720 mJ/cm$^2$) (Cf. FIG. 3(*b*)).

Then, after heated (160° C. for three minutes), the coating 11 exposed to light was developed, so that the coating 11 was formed in such a predetermined pattern that could allow the marginal portions of the supporting board 2 to be exposed and could allow the portions thereof where the conductive concave portions 9 were to be formed to have a thickness smaller than the remaining portions (Cf. FIG. 3(*c*)). Thereafter, the coating 11 was heated at 420° C. to thereby form the insulating base layer 3 of polyimide resin having a thickness of 10 µm (Cf. FIG. 3(*d*)).

Then, a thin chromium film and a thin copper film were sequentially formed on the surface of the supporting board 2 exposed from the insulating base layer 3 and on the entire surface of the insulating base layer 3 by the sputtering process to form the thin metal film 14 having thickness of 300-1,000 Å (Cf. FIG. 4(*a*)). Then, after laminated on the surface of the thin metal film 14, the dry film photoresist was exposed to ultraviolet light (an integrated quantity of exposure light of 235 mJ/cm$^2$) and then developed by alkaline developer to form the plating resist 15 having the reverse pattern to the conductive pattern 4 on the thin metal film 14 (Cf. FIG. 4(*b*)).

Then, the conductive pattern 4 having thickness of 10 µm was formed on the surface of the thin metal film 14 exposed from the plating resist 15 by electrolytic copper plating (Cf. FIG. 4(*c*)). Thereafter, the plating resist 15 was stripped (Cf.

FIG. 4(d)) and then the thin metal film 14 exposed from the conductive pattern 4 was removed by chemical etching (Cf. FIG. 4(e)).

As a result of these processes, the conductive pattern 4 wherein a number of lines of wire 4a, 4b, 4c, 4d, the magnetic head connecting terminals 7, and the external connecting terminals 8 were integrally formed was formed. The width of the each external connecting terminal 8 was 300 µm, and the interval between adjacent external connecting terminals 8 was 250 µm. Also, the conductive concave portions 9 were formed in the external connecting terminals 8. The diameter of the each conductive concave portion 9 was 150 µm and the depth thereof was 5 µm.

Then, after the surface of the conductive pattern 4 was activated by palladium solution, the nickel plating layer having thickness of 0.05 µm was formed on the surface thus activated by electrolytic nickel plating. Thereafter, solution of precursor of photosensitive polyimide resin was coated over the entire surface of the nickel plating layer and the insulating base layer 3 and then was heated for two minutes at 120° C., to thereby form the coating 16 of precursor of the photosensitive polyimide resin (Cf. FIG. 5(a)).

Thereafter, the photomask 17 was disposed opposite the coating 16 so that the light shielding portions 17a confronted portions of the coating 16 where the insulating base layer 3 was not to be formed on the supporting board 2 and portions of the coating 16 corresponding to the magnetic head connecting terminals 7 and the external connecting terminals 8, and the total-light-transmitting portions 17b confronted portions of the coating 16 where the insulating cover layer 10 was to be formed on the insulating base layer 3 including the lines of wire 4a, 4b, 4c, 4d. Then, the coating 16 was exposed to ultraviolet light (an integrated quantity of exposure light of 720 mJ/cm$^2$) (Cf. FIG. 5(b)).

Then, after heated (160° C. for three minutes), the coating 16 exposed to light was developed using alkaline developer, so that the coating 16 was formed in such a predetermined pattern that could allow the lines of wire 4a, 4b, 4c, 4d to be covered with the coating 16 and could allow the magnetic head connecting terminals 7 and the external connecting terminals 8 to be exposed therefrom (Cf FIG. 5(c)). Thereafter, the coating 16 was heated at 420° C. to thereby form the insulating cover layer 10 of polyimide resin having a thickness of 4 µm (Cf. FIG. 5(d)).

Then, after the nickel plating layer on the magnetic head connecting terminals 7 and on the external connecting terminals 8 was removed by chemical etching, the dry film photoresist was laminated thereon. Then, the lamination was exposed to ultraviolet light (an integrated quantity of exposure to light of 105 mJ/cm$^2$) and was developed using alkaline developer. The supporting board 2 was covered with the dry film photoresist to cover the outer shape of the suspension board with circuit 1, the supporting board 2 thus covered was etched using ferric chloride solution to cut out to form the gimbal 5 and trimmed along the outer shape of the suspension board with circuit 1.

Thereafter, the plating layer 18 of 3.5 µm thick comprising the nickel plating layer and the gold plating layer was formed on the respective magnetic head connection terminals 7 and on the respective external connecting terminals 8 by electroless nickel plating and by electroless gold plating (Cf. FIG. 2(e)).

Comparative Example 1

Figure 8:
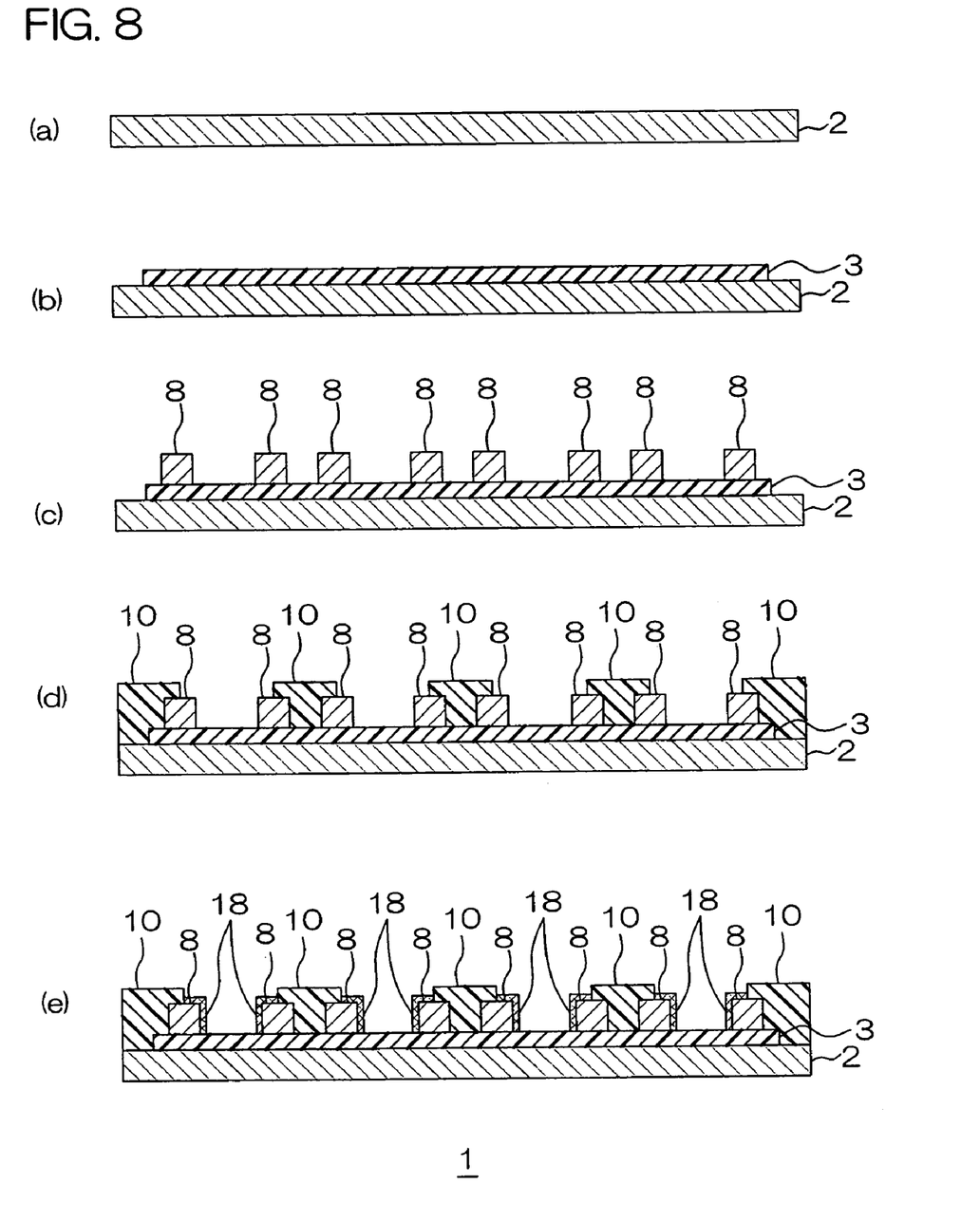
FIG. 8 is a process drawing showing a production method of a suspension board with circuit of Comparative Example 1, (a) showing the process of preparing a supporting board, (b) showing the process of forming an insulating base layer with a predetermined pattern on the supporting board, (c) showing the process of forming a conductive pattern on the insulating base layer, (d) showing the process of forming an insulating cover layer with a predetermined pattern on the insulating base layer, and (e) showing the process of forming a plating layer on each magnetic head connecting terminal and each external connecting terminal.

The supporting board 2 of a stainless foil (SUS304) of 300 mm wide and 25 µm thick was prepared (Cf. FIG. 8(a)).

Then, the insulating base layer 3 of polyimide resin was formed by the same processes as in Example 1 (Cf. FIG. 8(b)). The insulating base layer 3 formed was uniform in thickness and had no depressed portions on portions thereof where the external connecting terminals 8 were to be formed.

Then, the conductive pattern 4 wherein a number of lines of wire 4a, 4b, 4c, 4d, the magnetic head connecting terminals 7, and the external connecting terminals 8 were integrally formed on the insulating base layer 3 was formed by the same processes as in Example 1 (Cf. FIG. 8(c)). The external connecting terminals 8 were formed in ring form having the cavities at centers thereof, without forming the conductive concave portions 9 therein.

Then, after the nickel plating layer of 0.05 µm thick was formed on the surface of the conductive pattern 4 by the same processes as in Example 1, the insulating cover layer of polyimide resin, with which the lines of wire 4a, 4b, 4c, 4d were covered and from which the magnetic head connecting terminals 7 and the external connecting terminals 8 were exposed, was formed on the insulating base layer 3 (Cf. FIG. 8(d)).

Then, after the nickel plating layer on the magnetic head connecting terminals 7 and on the external connecting terminals 8 was removed by the same process as in Example 1, the supporting board 2 was cut out to form the gimbal 5 and trimmed along the outer shape of the suspension board with circuit 1. Thereafter, the plating layer 18 comprising the nickel plating layer and the gold plating layer was formed (Cf. FIG. 8(e)).

Comparative Example 2

Figure 9:
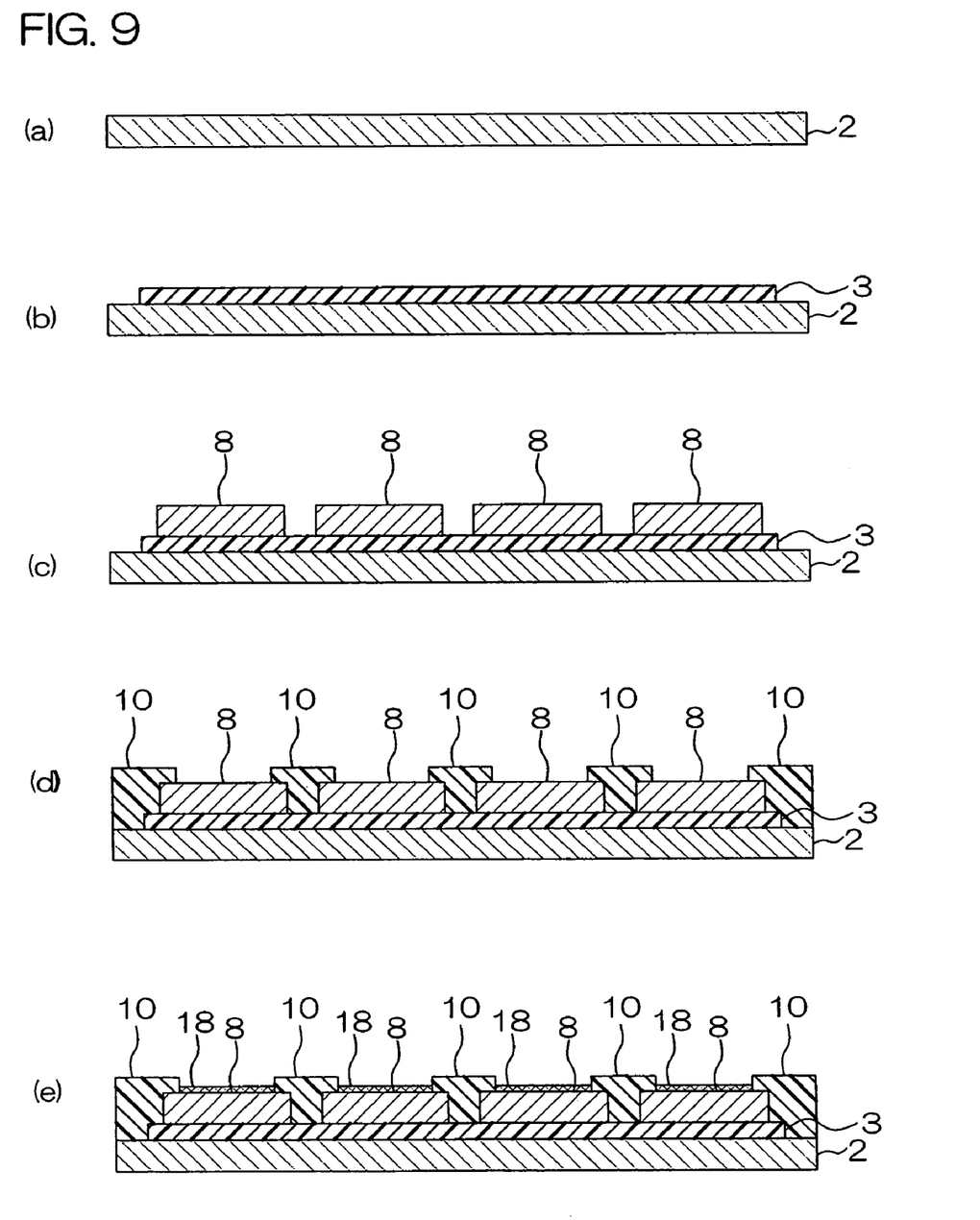
FIG. 9 is a process drawing showing a production method of a suspension board with circuit of Comparative Example 2, (a) showing the process of preparing a supporting board, (b) showing the process of forming an insulating base layer with a predetermined pattern on the supporting board, (c) showing the process of forming a conductive pattern on the insulating base layer, (d) showing the process of forming an insulating cover layer with a predetermined pattern on the insulating base layer, and (e) showing the process of forming a plating layer on each magnetic head connecting terminal and each external connecting terminal.

The supporting board 2 of a stainless foil (SUS304) of 300 mm wide and 25 µm thick was prepared (Cf. FIG. 9(a)).

Then, the insulating base layer 3 of polyimide resin was formed by the same processes as in Example 1 (Cf. FIG. 9(b)). The insulating base layer 3 formed was uniform in thickness and had no depressed portions on portions thereof where the external connecting terminals 8 were to be formed.

Then, the conductive pattern 4 wherein a number of lines of wire 4a, 4b, 4c, 4d, the magnetic head connecting terminals 7, and the external connecting terminals 8 were integrally formed on the insulating base layer 3 was formed by the same processes as in Example 1 (Cf. FIG. 9(c)). The external connecting terminals 8 were formed to have uniform thickness without forming the conductive concave portions 9.

Then, after the nickel plating layer of 0.05 µm thick was formed on the surface of the conductive pattern 4 by the same processes as in Example 1, the insulating cover layer of polyimide resin, with which the lines of wire 4a, 4b, 4c, 4d were covered and from which the magnetic head connecting terminals 7 and the external connecting terminals 8 were exposed, was formed on the insulating base layer 3 (Cf. FIG. 9(d)).

Then, after the nickel plating layer on the magnetic head connecting terminals 7 and on the external connecting terminals 8 was removed by the same process as in Example 1, the supporting board 2 was cut out to form the gimbal 5 and trimmed along the outer shape of the suspension board with circuit 1. Thereafter, the plating layer 18 comprising the nickel plating layer and the gold plating layer was formed (Cf. FIG. 9(e)).

Evaluation

The external connecting terminals 8 of the suspension boards with circuits obtained in Example 1 and Comparative Examples 1 and 2 were connected with the connecting terminals of the read/write connecting terminals via the solder balls 21. The suspension board with circuit of Example 1 was able to be connected with the read/write substrate reliably. However, in the suspension board with circuit of Comparative Example 1, electrical conductive failure occurred, and in the suspension board with circuit of Comparative Example 2, the solder balls 21 were rolled down, thus producing reduced working efficiency in the connecting process.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
    an insulating layer having concave portions provided therein;
    a conductive pattern formed on the insulating layer;
    a metal supporting layer provided on an opposite side of the insulating layer from the conductive pattern;
    a terminal that is integrally formed with the conductive pattern, the terminal being provided on the corresponding concave portion of the insulating layer and being adapted to electrically connect with external terminals of an external device; and
    a concave terminal portion formed integrally with and defined in the terminal, the concave terminal portion being adapted to receive a molten metal to mechanically couple the terminal and the external device.

2. The wired circuit board according to claim 1, wherein the concave portions of the insulating layer include a depth that is 20%-60% of a thickness of the insulating layer.

3. A wired circuit board comprising:
    an insulating layer;
    a conductive pattern formed on the insulating layer;
    a terminal that is formed on the insulating layer to be integral with the conductive pattern, the terminal being adapted to be electrically connected with external terminals of an external device;
    a concave terminal portion formed integrally with and defined in the terminal to receive molten metal that mechanically couples the terminal and the external device;
    wherein the insulating layer further comprises concave portions corresponding in shape to the concave terminal portion; and
    wherein the concave terminal portion is formed within the corresponding concave portions of the insulating layer.

4. The wired circuit board according to claim 3, wherein the concave portions of the insulating layer include a depth that is 20%-60% of a thickness of the insulating layer.

* * * * *